(12) United States Patent
Hsu et al.

(10) Patent No.: US 7,535,163 B2
(45) Date of Patent: May 19, 2009

(54) SYSTEM FOR DISPLAYING IMAGES INCLUDING ELECTROLUMINESCENT DEVICE AND METHOD FOR FABRICATING THE SAME

(75) Inventors: Hsiang-Lun Hsu, Miaoli (TW); Ryan Lee, Hualien (TW)

(73) Assignee: TPO Displays Corp., Chu-Nan (TW)

( * ) Notice: Subject to any disclaimer, the term of this patent is extended or adjusted under 35 U.S.C. 154(b) by 535 days.

(21) Appl. No.: 11/360,652

(22) Filed: Feb. 22, 2006

(65) Prior Publication Data

US 2007/0194696 A1 Aug. 23, 2007

(51) Int. Cl.
*H01J 1/62* (2006.01)

(52) U.S. Cl. ........................................ 313/504; 313/506

(58) Field of Classification Search ................ 313/498, 313/504, 506

See application file for complete search history.

(56) References Cited

U.S. PATENT DOCUMENTS

2006/0138922 A1* 6/2006 Kim et al. ...................... 313/11

FOREIGN PATENT DOCUMENTS

CN  1510974  7/2004

OTHER PUBLICATIONS

Gu, G., et al; "High-External-Quantum-Efficiency Organic Light-Emitting Devices"; Optics Letters/vol. 22, No. 6/Mar. 15, 1997; pp. 396-398.

* cited by examiner

*Primary Examiner*—Vip Patel
(74) *Attorney, Agent, or Firm*—Liu & Liu

(57) ABSTRACT

Systems for displaying images and fabrication method thereof are provided. A representative system incorporates an active matrix organic electroluminescent device that includes pixel areas, a pair of spaced pixel definition layers surrounding each pixel area, and a reflective layer formed on the surface of the pixel definition layers. Particularly, the pair of spaced pixel definition layers is separated by a trench, and the reflective layer covers the sidewalls and bottom of the trench.

14 Claims, 11 Drawing Sheets

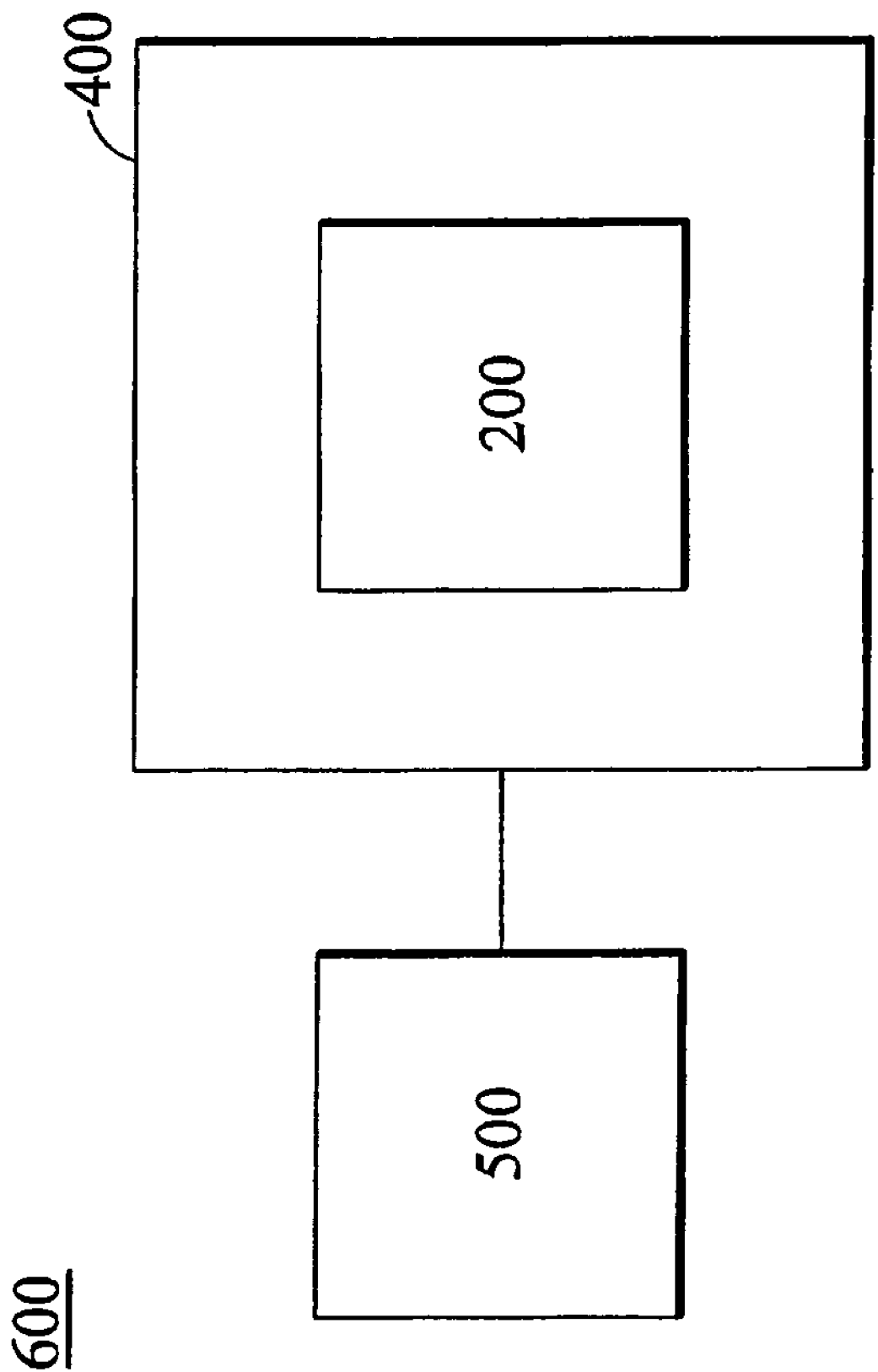

SYSTEM FOR DISPLAYING IMAGES INCLUDING ELECTROLUMINESCENT DEVICE AND METHOD FOR FABRICATING THE SAME

BACKGROUND

The present invention relates to an electroluminescent device and a method for fabricating the same and, more particularly, to an active matrix organic electroluminescent device with high color purity and fabrication method thereof.

Recently, with the development and wide application of electronic products such as mobile phones, PDA, and notebook computers, there has been increasing demand for flat display devices which consume less electric power and occupy less space. Organic electroluminescent devices are self-emitting and highly luminous, with wider viewing angle, faster response speed, and a simple fabrication process, making them an industry display of choice.

Organic light-emitting diodes (OLED) use an organic electroluminescent layer. The trend in organic electroluminescent display technology is for higher luminescent efficiency and longer lifetime. As a result, an active matrix organic electroluminescent device with thin film transistors has been developed to solve the aforementioned problems. The active matrix organic electroluminescent device has panel luminescence with thin and lightweight characteristics, spontaneous luminescence with high luminescent efficiency and low driving voltage, and advantages of increased viewing angle, high contrast, high-response speed, flexibility and full color. As the need for larger display devices with higher resolution grows, active matrix organic electroluminescent devices are poised to achieve a major market trend.

FIG. 1 is a sectional diagram of a conventional active matrix organic electroluminescent device 100, comprising a substrate 10, a TFT array 20, red light emitting diode R, green G, and blue light emitting diode B. Each of light emitting diodes R, G, and B comprises an ITO electrode serving as an anode 30, electroluminescent layers 40, and a metal electrode serving as a cathode 50. Particularly, to isolate the light emitting diodes R, G, and B from interference, a pixel definition layer 60 is formed between each two adjacent light emitting diodes. However, since transparent compounds serve as the pixel definition layer 60 in the conventional active matrix organic electroluminescent device 100, the side emitting light 42 from one light emitting diode (such as red light emitting diode R) infringes on adjacent light emitting diodes (such as blue and green light emitting diodes B and G) through reflection of the cathode 50, resulting in light leakage and luminescent interference.

To overcome the drawbacks described, opaque organic compounds have replaced transparent compounds, for the pixel definition layer. However, the opaque organic compounds, such as pigment, generally comprise carbon-containing material with conductivity or low dielectric constant, resulting in inferior electrical and optical characteristics. Further, since the side emission of light emitting diodes is absorbed by the opaque organic compounds, luminance efficiency is reduced.

Thus, in order that luminance efficiency not be reduced, an active matrix organic electroluminescent device with high color purity is called for.

SUMMARY

Systems for displaying images are provided. In this regard, an exemplary embodiment of such as system comprises a light-emitting device, such as a full-color active matrix organic electroluminescent device, comprising a pixel area, a pair of spaced pixel definition layers surrounding the pixel area, and a reflective layer formed on the surface of the pixel definition layers. Particularly, the pixel definition layers are separated by a trench, sidewalls and bottom of which are covered by the reflective layer. Since side emission can be transmitted out without interfering with the adjacent pixel areas, light leakage and luminescence interference are avoided and extraction efficiency greatly increased.

Methods for fabricating the system for displaying images are also provided, in which a thin film transistor array substrate with a plurality of pixel areas is provided. A flat layer is formed on the substrate. A first electrode is formed on the flat layer within each pixel area. A pair of spaced pixel definition layers separated by a trench is formed on the flat layer surrounding each pixel area. An electroluminescent layer is formed on the first electrode. A second electrode is formed on the electroluminescent layer. A reflection layer is formed on the surface of the trench and the pixel definition layers. Particularly, the reflective layer and the second electrode are of the same material and formed by the same process.

A detailed description is given in the following with reference to the accompanying drawing.

BRIEF DESCRIPTION OF THE DRAWINGS

The invention can be more fully understood by reading the subsequent detailed description in conjunction with the examples and references made to the accompanying drawings.

FIG. 5 schematically shows another embodiment of a system for displaying images

DETAILED DESCRIPTION

The invention uses a reflective pixel definition structure to prevent from light leakage and luminescence interference, with no increase in process complexity. Furthermore, since side emission is transmitted out, extraction efficiency is greatly increased. A method of fabricating the active matrix organic electroluminescent device 200 is provided.

Figure 1:
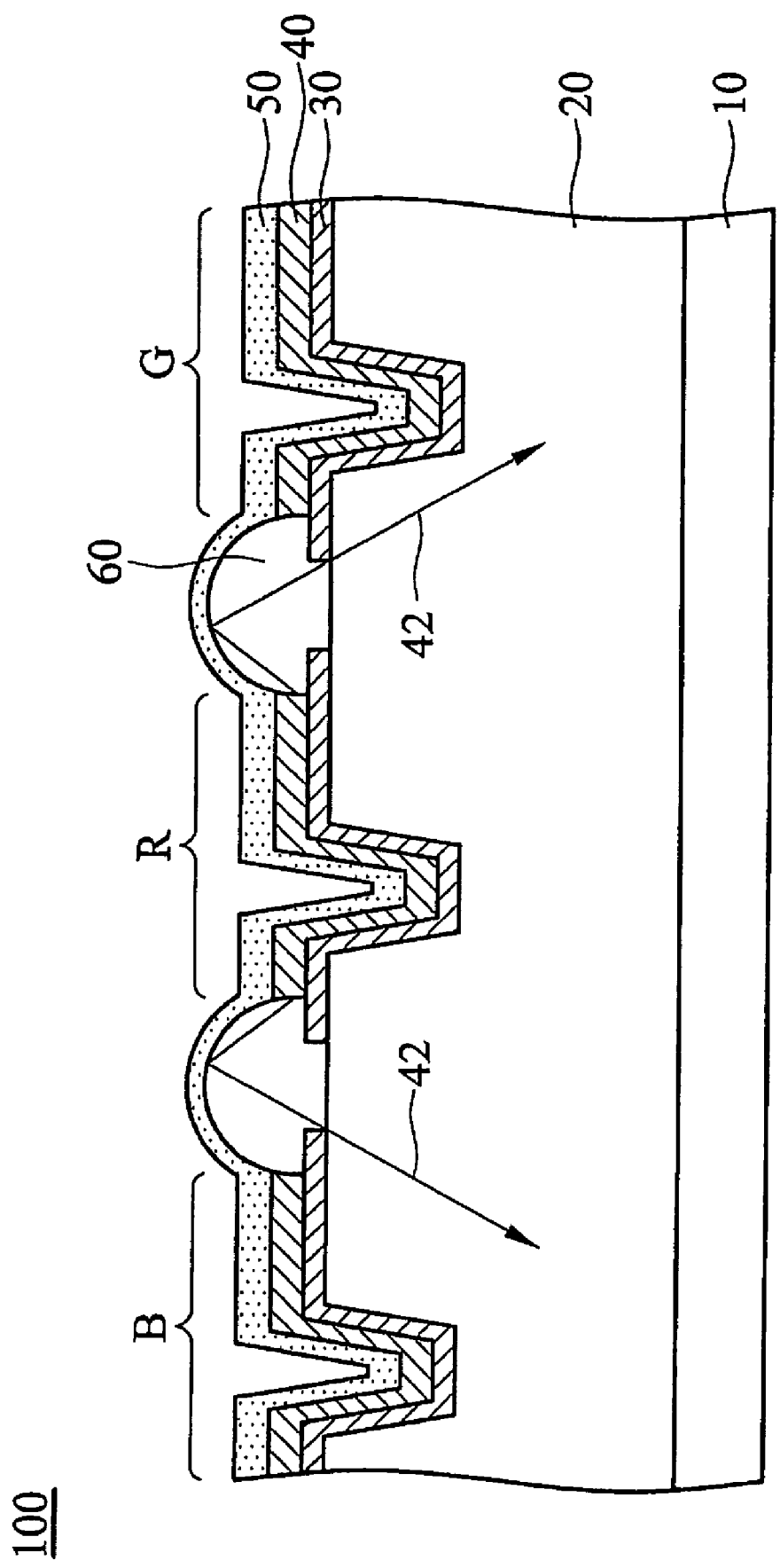
FIG. 1 is a cross section of a conventional active matrix organic electroluminescent device.
Figure 2A:
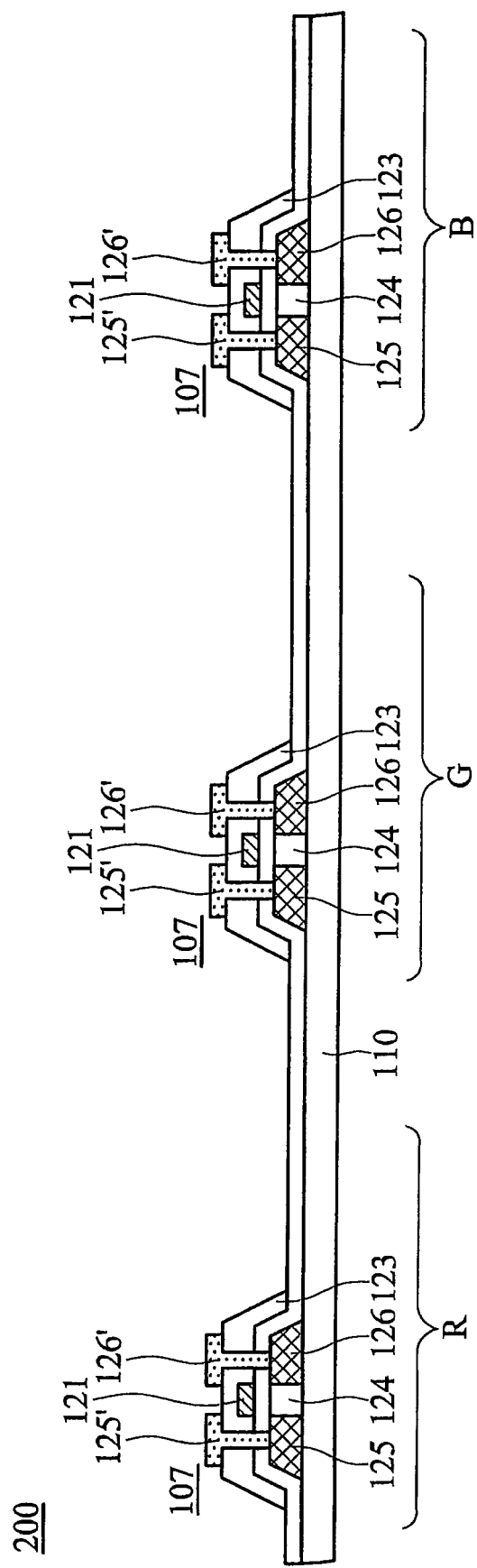
FIGS. 2A to 2G are cross-sections showing a method of fabricating a system for displaying images incorporating an active matrix organic electroluminescent device according to embodiments of the invention.
Figure 2B:
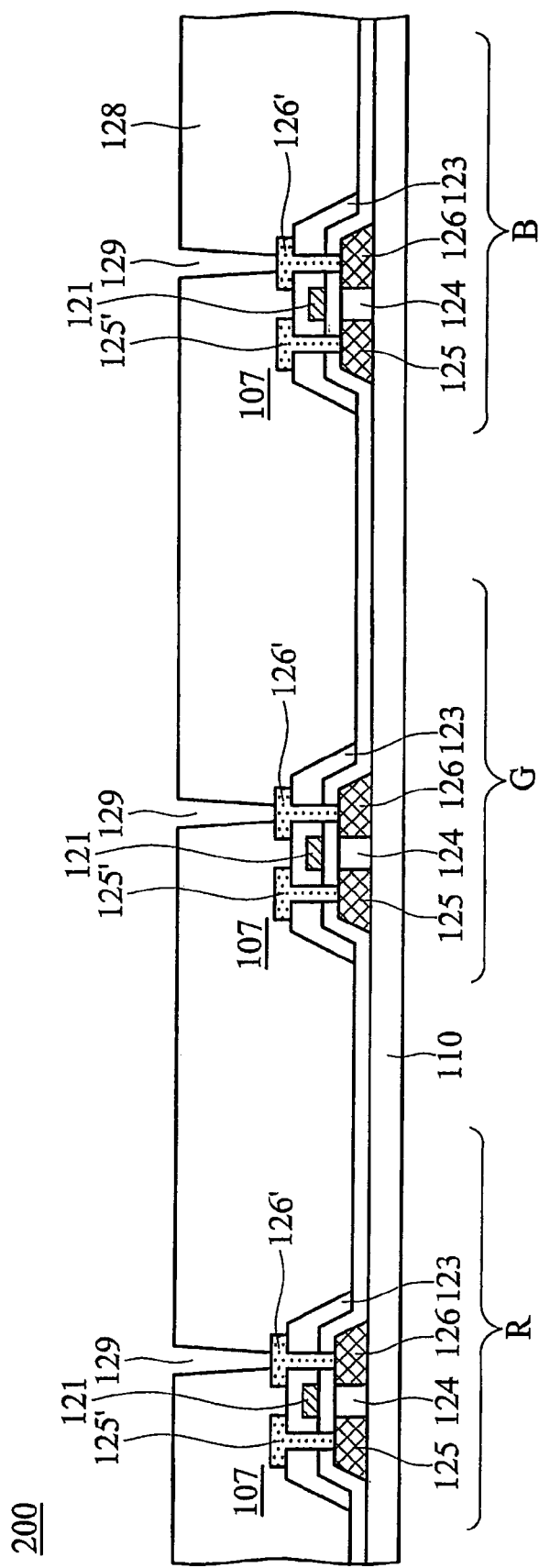
Figure 2C:
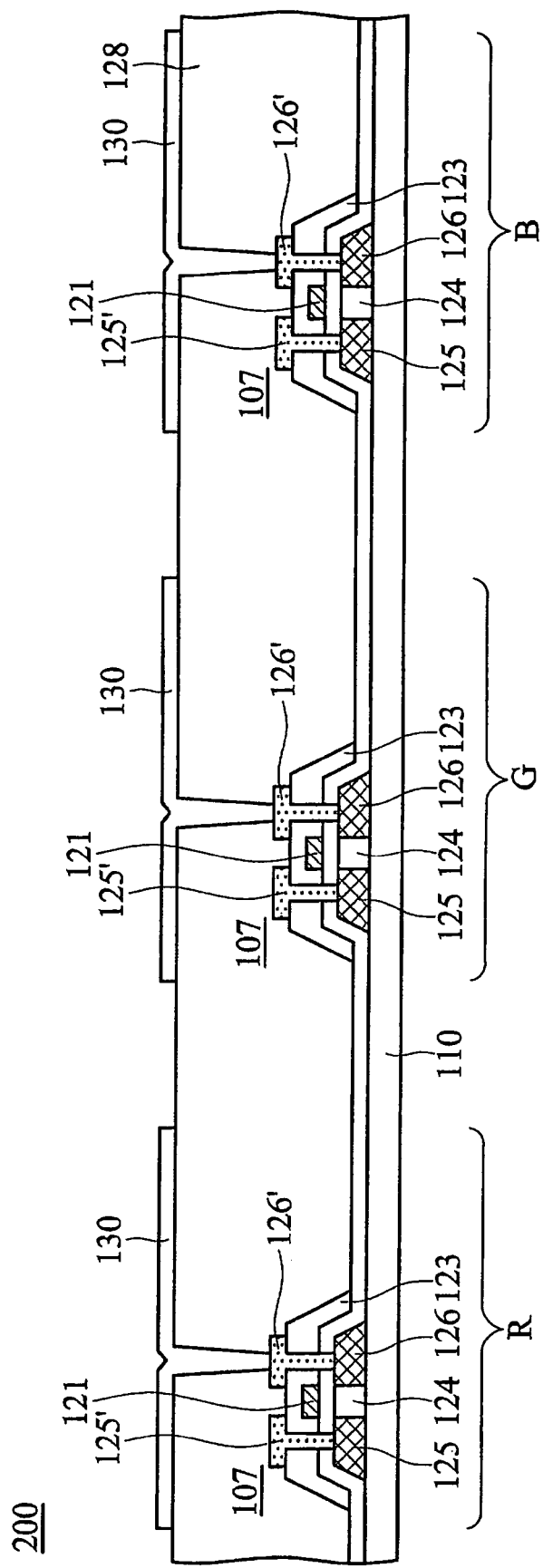
Figure 2D:
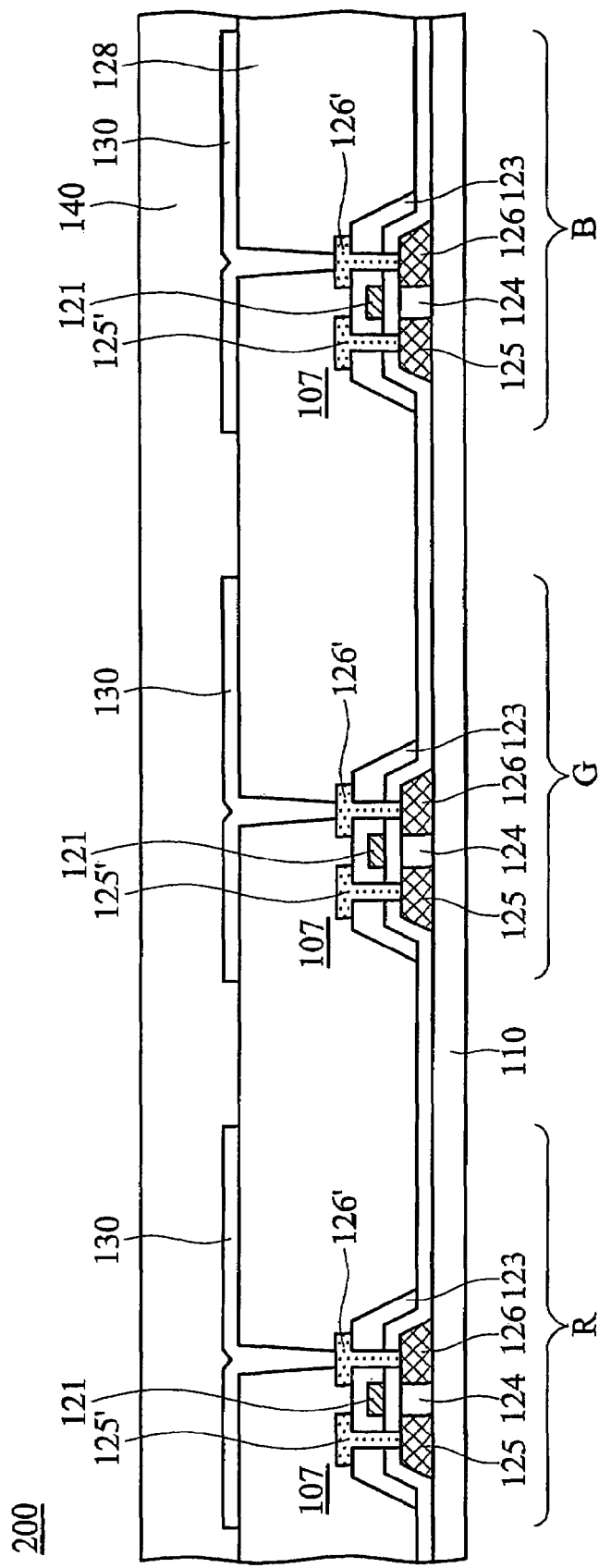
Figure 2E:
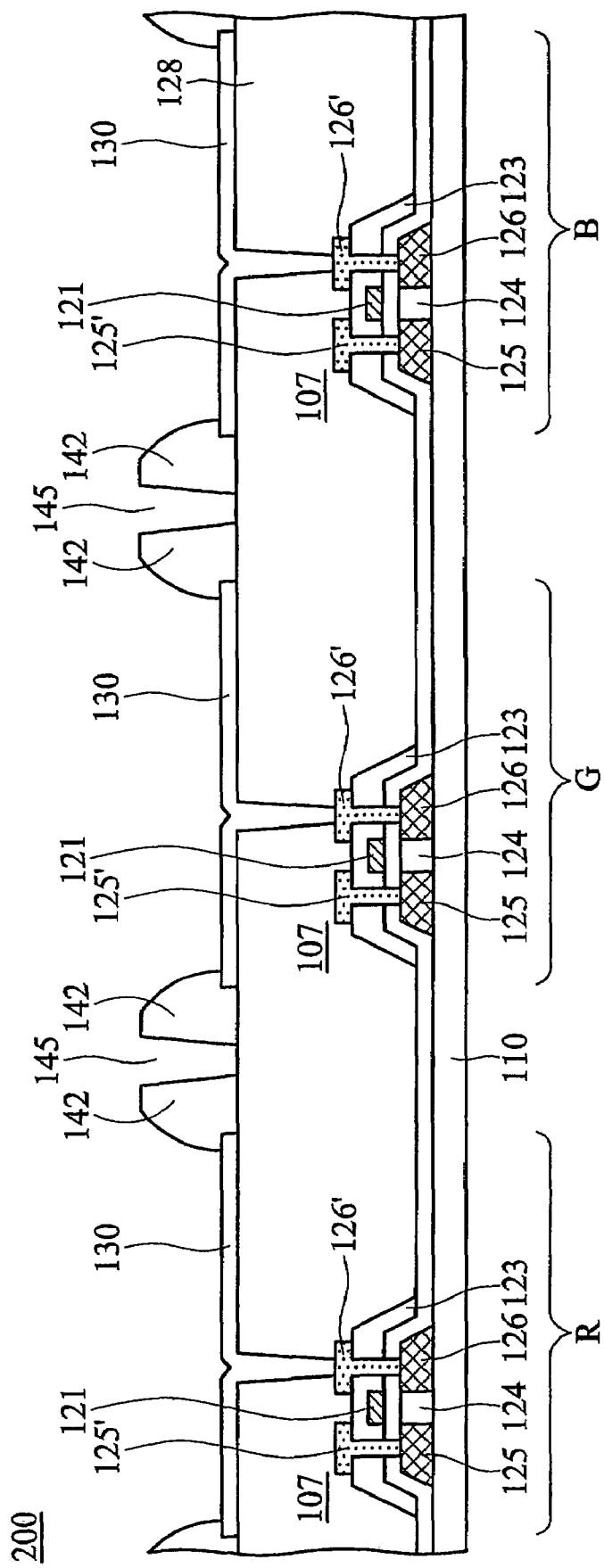
Figure 2F:
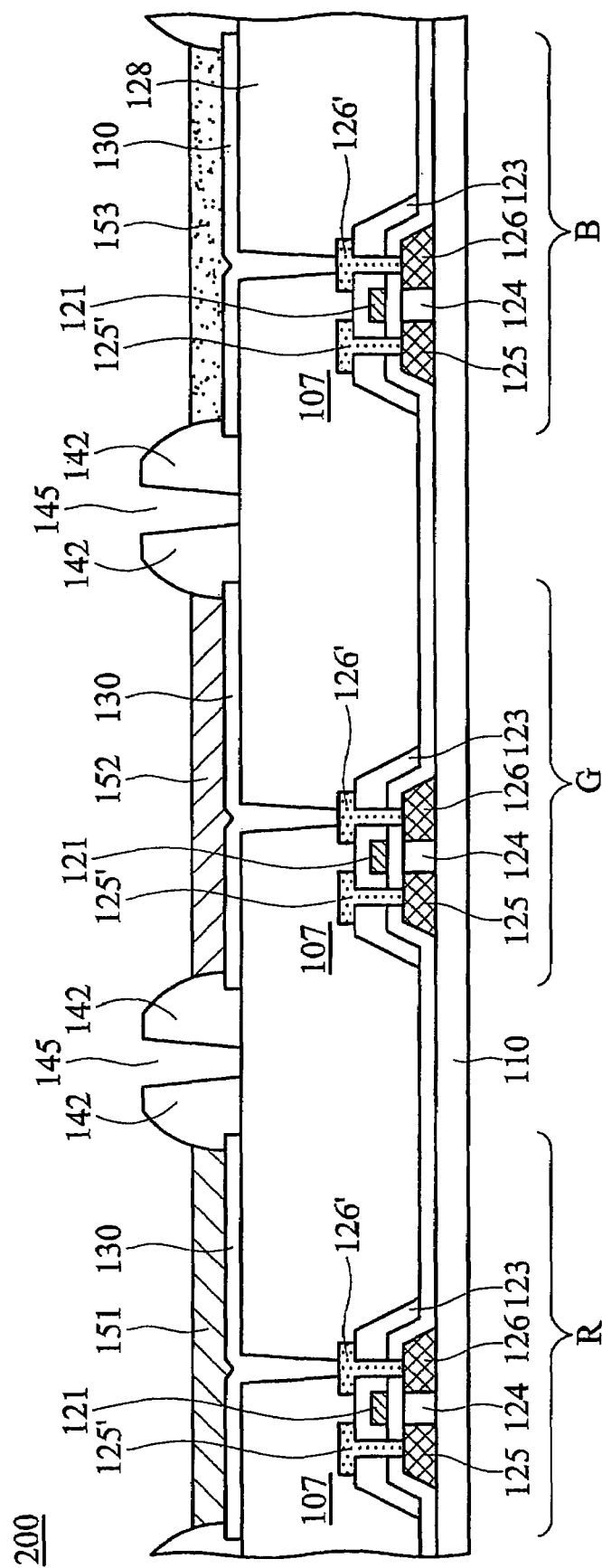
Figure 2G:
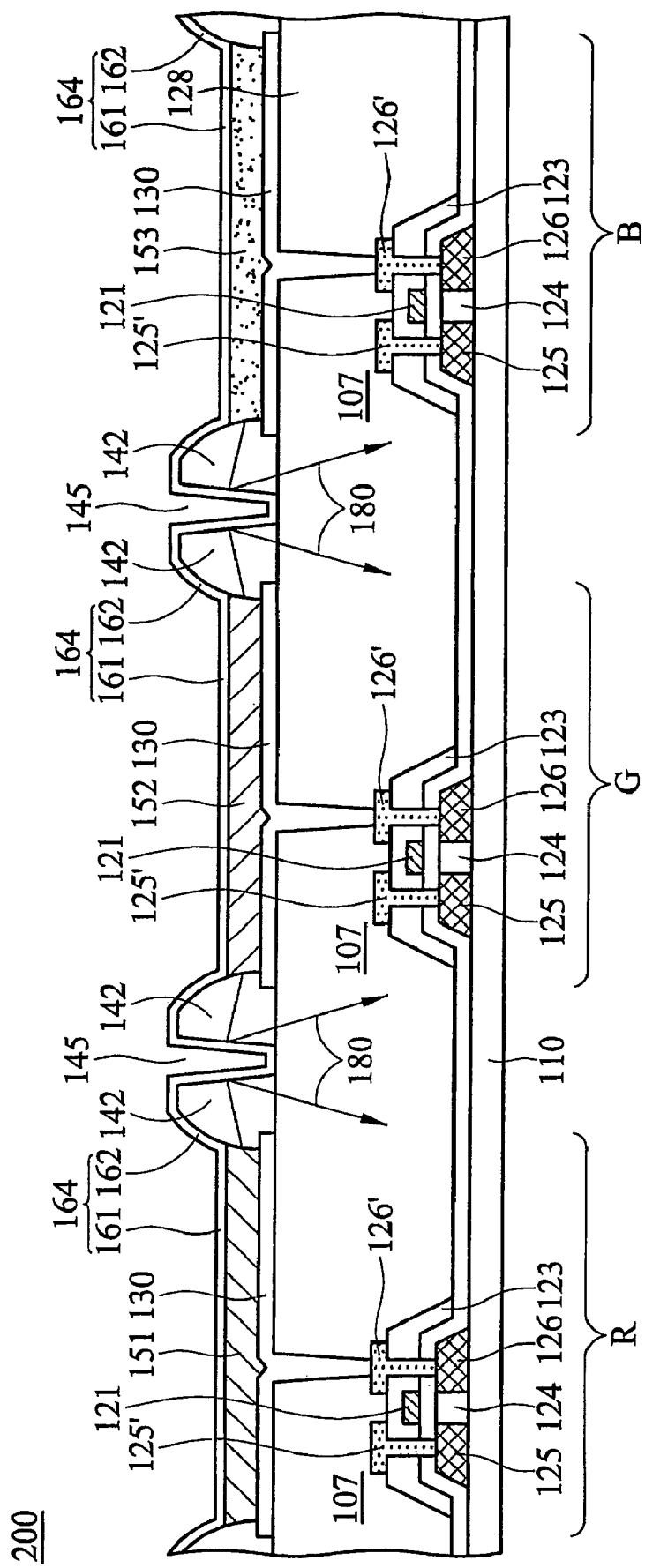

FIG. 2G shows an embodiment of a system for displaying images that includes a light-emitting device, such as an active matrix organic electroluminescent device 200. FIGS. 2A to 2G are cross-sections showing a method of fabricating an active matrix organic electroluminescent device according to an embodiment of the invention.

As shown in FIG. 2A, a thin film transistor array substrate 110 is provided, defined as a red pixel area R, a green pixel area G, and a blue pixel area B, and each pixel area comprising a TFT 107. The TFT comprises a semiconductor layer 124, a gate electrode 121, a gate insulator 123, a source electrode 125, and a drain electrode 126. The thin film transistor 107 can be amorphous-silicon thin film transistor, low temperature poly-silicon thin film transistor (LTPS-TFT), organic thin film transistor (OTFT), or others. Furthermore, the TFT 107 can also comprise a source contact area 125' and a drain contact area 126', wherein the source contact area 125' and the drain contact area 126' electrically connect to the source electrode 125 and drain electrode 126 respectively. The structure of the thin film transistor illustrated is an example, and is not intended to be limitative of the invention. Herein, the gate insulator 123 can be a silicon nitride, and the substrate 110 a transparent insulating material such as glass or plastic.

As shown in FIG. 2B, a flat layer 128 is formed on the substrate 110 to cover the thin film transistor 107. The flat layer 128 has a low surface roughness and can be dielectric or insulator material such as low temperature dielectric material or spin-on glass (SOG). The flat layer 128 can be organic or inorganic material. Next, the flat layer 128 is patterned to form contact holes 129, exposing the surface of the drain contact area 126'.

As shown in FIG. 2C, a transparent conductive layer is formed on the flat layer 128 and patterned to form first electrodes 130 within the pixel area. The first electrode 130 can be transparent. The transparent electrode 130 electrically connects to the drain contact area 126' through the contact hole 129. Suitable material for the transparent electrode 130 is transparent metal or metal oxide, such as indium tin oxide (ITO), indium zinc oxide (IZO), aluminum zinc oxide (AZO), or zinc oxide (ZnO). The transparent electrode 130 can be formed by sputtering, electron beam evaporation, thermal evaporation, or chemical vapor deposition.

Figure 3:
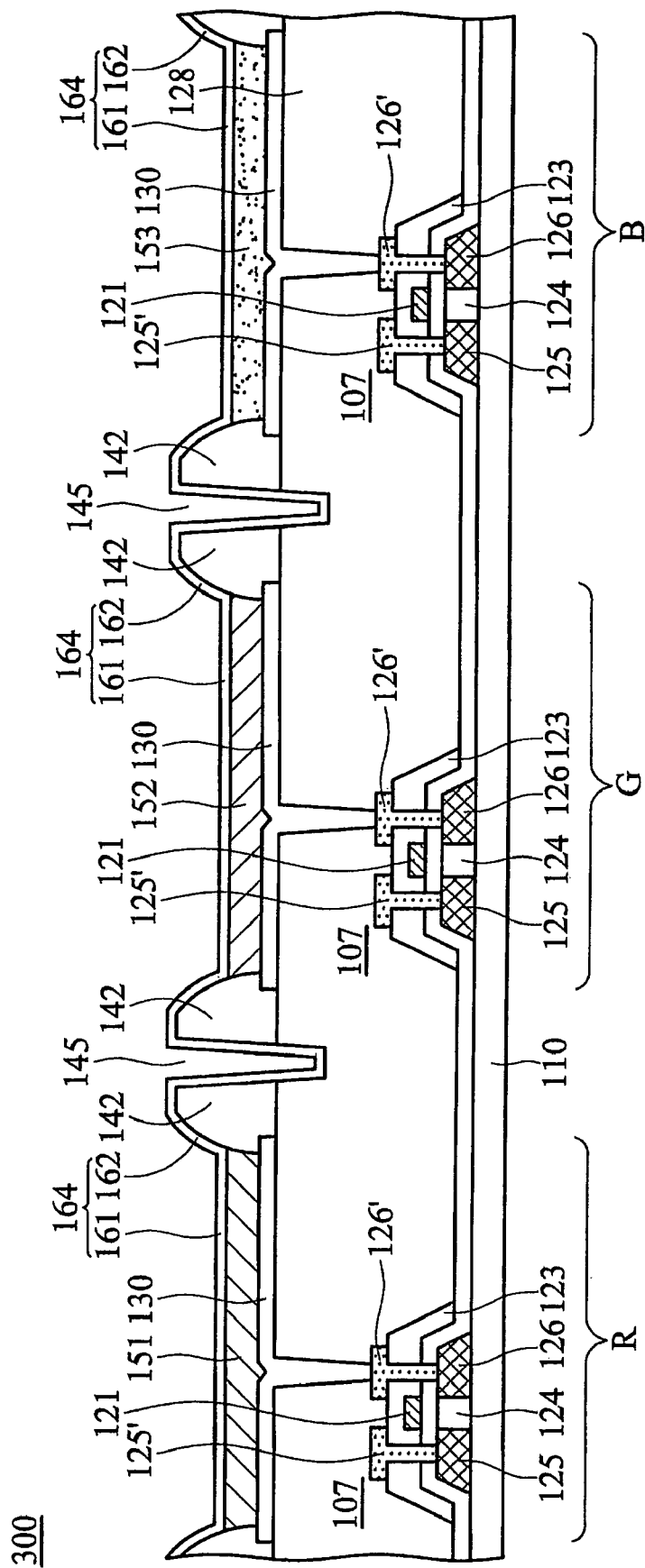
FIG. 3 is a schematic top view of an active matrix organic electroluminescent device according to an embodiment of the invention.

As shown in FIG. 2D, a transparent insulating layer 140 is formed on the substrate 110. Materials of the transparent insulating layer 140 can be transparent organic compounds and can be materials suitable for use in photoelectric devices, such as photo-curable resin or thermal-curable resin. Herein, the transparent insulating layer 140 is subsequently patterned to form a pair of spaced pixel definition layer 142 surrounding each pixel area, as shown in FIG. 2E. It should be noted that the pair of spaced pixel definition layer 142 is formed beyond the pixel areas R, G, B (roughly beyond the first electrode 130), and separated by a trench 145 surrounding each pixel area. The trench can expose the surface of the flat layer 128. Further, the trench can also be formed into the flat layer 128 by etching, as shown in FIG. 3. Since the spaced pixel definition layers 142 separated by the trench 145 are formed by a single photolithography step, the process complexity is not increased compared to the conventional AMOLED process.

As shown in FIG. 2F, a red organic electroluminescent layer 151, green organic electroluminescent layer 152, and blue organic electroluminescent layer 153 are formed respectively in the red pixel area R, green pixel area G, and blue pixel area B by photolithography. The red, green, and blue organic electroluminescent layers can be organic semiconductor material, such as small molecule material, polymer, or organometallic complex formed by thermal vacuum evaporation, spin coating, dip coating, roll-coating, injection-filling, embossing, stamping, physical vapor deposition, or chemical vapor deposition.

As shown in FIG. 2G, a metal conductive layer 164 is conformally formed on the structure, covering all exposed surfaces of the organic electroluminescent layer, the pixel definition layers 142, and the sidewall and bottom of the trench 145. Particularly, the metal conductive layer 164 formed on the organic electroluminescent layer serves as a second electrode 161, and the metal conductive layer 164 formed on the sidewall and bottom of the trench 145 serves as a reflective layer 162. Thus, the second electrode 161 and reflective layer 162 are of the same material and formed by the same process. The first electrode 130 can act as an anode, and the second electrode 161 can act as a cathode. The first electrode 130 acting as an anode, the organic electroluminescent layer 151, 152 or 153, and the second electrode 161 acting as a cathode constitute an organic light-emitting diode. FIG. 2G shows three organic light-emitting diodes. The metal conductive layer 164 can be capable of injecting electrons into an organic electroluminescent layer, for example, a low work function material such as Ca, Ag, Mg, Al, Li, or alloys thereof. Furthermore, in some embodiments of the invention, the reflective layer 162 and the second electrode 161 can be formed in distinct steps and distinct materials.

According to another embodiment of the invention, in the active matrix organic electroluminescent device 300, the trench 145 separating the pixel definition layers 142 can be further formed down into the flat layer 128 by etching, as shown in FIG. 3.

Figure 4:
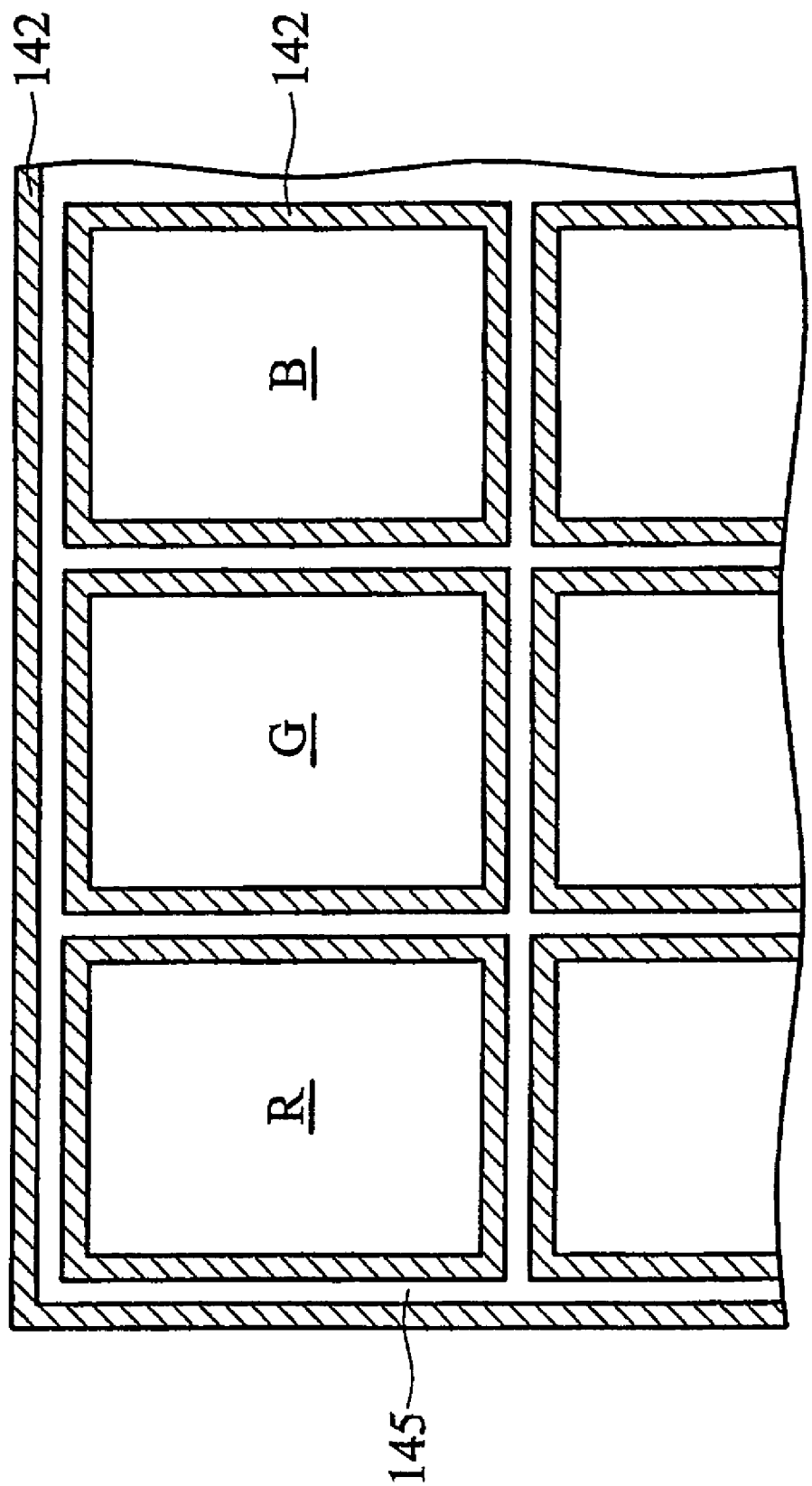
FIG. 4 is a schematic top view of the active matrix organic electroluminescent device according to an embodiment of the invention.

FIG. 4 is a schematic top view of the active matrix organic electroluminescent device 200. The red, blue, and green pixel areas R, G, and B are isolated by the surrounding pixel definition layer 142, and the trench 145 separates the pair of spaced pixel definition layer 142. As shown in FIG. 2G, since the reflective layer 162 is formed on the sidewalls and bottom of the trench 145, the side emitting light 180 can be guided to an outside without interfering with adjacent pixel areas. Accordingly, light leakage and luminescence interference are avoided. Further, compared with conventional active matrix organic electroluminescent devices, luminescent efficiency is significantly improved.

FIG. 5 schematically shows another embodiment of a system for displaying images which, in this case, is implemented as a display panel 400 or an electronic device 600. The described active matrix organic electroluminescent device can be incorporated into a display panel that can be an OLED panel. As shown in FIG. 5, the display panel 400 comprises an active matrix organic electroluminescent device, such as the active matrix organic electroluminescent device 200 shown in FIG. 2G and 300 shown in FIG. 3. The display panel 400 can form a portion of a variety of electronic devices (in this case, electronic device 600). Generally, the electronic device 600 can comprise the display panel 400 and an input unit 500. Further, the input unit 500 is operatively coupled to the display panel 400 and provides input signals (eg., an image signal) to the display panel 400 to generate images. The electronic device 600 can be a mobile phone, digital camera, PDA (personal data assistant), notebook computer, desktop computer, television, car display, or portable DVD player, for example.

While the invention has been described by way of example and in terms of preferred embodiment, it is to be understood that the invention is not limited thereto. It is therefore intended that the following claims be interpreted as covering all such alteration and modifications as fall within the true spirit and scope of the invention.

What is claimed is:

1. A system for displaying images, comprising:
a light-emitting device, comprising:
a pixel area;
a pair of spaced pixel definition layers, separated by a trench, surrounding the pixel area; and a reflective layer formed on the surface of the trench and the pixel definition layers.

2. The system as claimed in claim 1, wherein the pixel definition layer comprises a transparent organic compound.

3. The system as claimed in claim 2, wherein the transparent organic compound comprises a photo-curable resin or thermal-curable resin.

4. The system as claimed in claim 1, wherein the reflective layer comprises a metal layer.

5. The system as claimed in claim 1, wherein the light-emitting device is an active matrix organic electroluminescent device.

6. The system as claimed in claim 5, wherein the pixel area comprises a thin film transistor electrically connected to an organic light-emitting diode.

7. The system as claimed in claim 6, wherein the organic light-emitting diode comprises a first electrode, an electroluminescent layer, and a second electrode.

8. The system as claimed in claim 7, wherein the reflective layer connects to the second electrode of the organic light-emitting diode.

9. The system as claimed in claim 7, wherein the reflective layer and the second electrode are of the same material.

10. The system as claimed in claim 6 wherein the thin film transistor comprises an amorphous-silicon thin film transistor, low temperature poly-silicon thin film transistor, or organic thin film transistor.

11. The system as claimed in claim 1, wherein the trench is formed down into a flat layer, wherein the flat layer is formed below the pair of pixel definition layers.

12. The system s claimed in claim 1, further comprising a display panel, wherein the light-emitting device forms a portion of the display panel.

13. The system as claimed in claim 12, further comprising an electronic device, wherein the electronic device comprises:
   the display panel; and
   an input unit coupled to the display panel and operative to provide input to the display panel such that the display panel displays images.

14. The system as claimed in claim 13, wherein the electronic device is a mobile phone, digital camera, PDA (personal data assistant), notebook computer, desktop computer, television, car display, or portable DVD player.

* * * * *